United States Patent [19]
Rich

[11] Patent Number: 6,145,901
[45] Date of Patent: *Nov. 14, 2000

[54] PICK AND PLACE HEAD CONSTRUCTION

[76] Inventor: Donald S. Rich, P.O. Box 473, Long Valley, N.J. 07853

[ * ] Notice: Under 35 U.S.C. 154(b), the term of this patent shall be extended for 162 days.

[21] Appl. No.: 08/814,299

[22] Filed: Mar. 10, 1997

Related U.S. Application Data

[60] Provisional application No. 60/013,239, Mar. 11, 1996.

[51] Int. Cl.[7] .............................. B25J 15/06; B66C 1/02
[52] U.S. Cl. ...................................... 294/64.1; 414/752.1
[58] Field of Search ................................ 294/2, 64.1, 65, 294/87.1; 29/743, 759; 414/627, 737, 752; 901/40

[56] References Cited

U.S. PATENT DOCUMENTS

| | | | |
|---|---|---|---|
| 4,389,064 | 6/1983 | Laverriere | 294/64.1 |
| 4,480,780 | 11/1984 | Claeskens et al. | 29/743 |
| 4,624,050 | 11/1986 | Hawkswell | 29/743 |
| 4,741,567 | 5/1988 | Zimmer et al. | 294/65 |
| 4,784,562 | 11/1988 | Kishi et al. | 414/737 |
| 4,860,438 | 8/1989 | Chen | 294/64.1 |
| 4,910,864 | 3/1990 | Elliott | 294/2 |
| 5,251,946 | 10/1993 | Rossmeisl et al. | 294/64.1 |
| 5,575,376 | 11/1996 | Colamussi | 414/752 |
| 5,582,450 | 12/1996 | Nagai et al. | 294/64.1 |

*Primary Examiner*—Dean J. Kramer
*Attorney, Agent, or Firm*—Charles E. Temko

[57] ABSTRACT

Disclosed is an improved pick and place head construction of a type employed for transporting individual semiconductor chips and similar articles of manufacture during manufacturing processes, and similar non-manufacturing environments. The disclosed device includes a dual head for engaging the chips as well as improved structure for varying the space between the heads by means of programmable actuators. In one embodiment, the vacuum spindles which reciprocate axially to engage the chips are also capable of axial rotation to enable the engaged chips to be rotated as they are transported to a place location. Also disclosed are improved article engaging members formed of synthetic resinous foam materials to enable effective vacuum engagement of non-planar surfaces. One form provides for simultaneous static dissipation.

18 Claims, 9 Drawing Sheets

PICK AND PLACE HEAD CONSTRUCTION

RELATED APPLICATION

Reference is made to my provisional application, Ser. No. 60/013,239 filed Mar. 11, 1996.

BACKGROUND OF THE INVENTION

This invention relates generally to the field of material handling, and more particularly to an improved mechanism for transporting small articles from a first location to a second location, as might be involved during the manufacture of semi-conductor chips and the like. The disclosed construction is equally useful in the placing of a small component such as a label upon a container as the container proceeds along an assembly line. Such devices normally include a vacuum head for engaging and releasing the transported article, and are commonly referred to as pick and place mechanisms. Devices of this general type are known in the art, and the invention lies in the provision of an improved type of device offering improved adjustment capability, simplification of structure, and improved operation with corresponding ease of manufacture and resulting lower cost of production.

In the prior art, devices of this type have usually included a pneumatic cylinder which drives a spindle mounting a vacuum head on a free end thereof. The spindle is advanced and retracted as required along its own axis, to pick up or place the workpiece, and is transported in a plane normal to the axis of the spindle to move the workpiece from one location to another. Pneumatically operated devices are not without substantial utility, but they are accompanied by substantial disadvantages inherent in pneumatic operation. The principal problems are the lack of control or programmability with respect to stroke length, difficulty in monitoring spindle position along its axis, and excessive size, particularly when the workpiece is quite small. In addition, the pneumatic piston is often free to rotate about its own axis during operation, which can result in improper positioning of the workpiece at the place location. These shortcomings can be ameliorated only to a limited degree.

SUMMARY OF THE INVENTION

Briefly stated, the invention contemplates the provision of an improved non-pneumatic approach particularly suited for the transport of very small and lightweight workpieces, such as semi-conductor chips, adhesive labels, and the like. To this end, the disclosed embodiment incorporates in lieu of the pneumatic cylinder, one or more stepping motors or servos as driving means for the vacuum spindle. The device is readily interconnected to solid state controllers to greatly improve the level of programmability. The device includes means to translate the rotary motions of the stepper motors or servos into linear axial motion required by the spindle. This is most conveniently performed by a helical rack and pinion, which is readily manufactured as a threaded hollow shaft which forms the rack having an anti-rotational key, and an adjacent mating pinion driven by a stepper motor or servo. This construction can be manufactured far more easily than using a rack having an orthogonal axis.

In a preferred embodiment, the device comprises a pair of units mounted opposite each other and arranged for mutual spaced adjustment in a plane normal to the axis of the parallel shafts. The pitch between the axes of the shafts is varied by a cam which engages cam follower surfaces on each unit to enlarge the pitch, when required, against the action of a return spring. The cam is driven by a linear drive stepper motor and can be operated while transporting the unit from pick up location to place location. In an alternate embodiment, the units are each mounted on a rectilinear rack, the racks being driven by a common pinion.

In a further alternate embodiment, one of the units is mounted in fixed position, and the other is driven along the rack toward and away from the other unit by a motor carried by the first unit.

BRIEF DESCRIPTION OF THE DRAWINGS

In the drawings, to which reference will be made in the specification, similar reference characters have been employed to designate corresponding parts throughout the several views.

DETAILED DESCRIPTION OF THE DISCLOSED EMBODIMENTS

Figure 1:
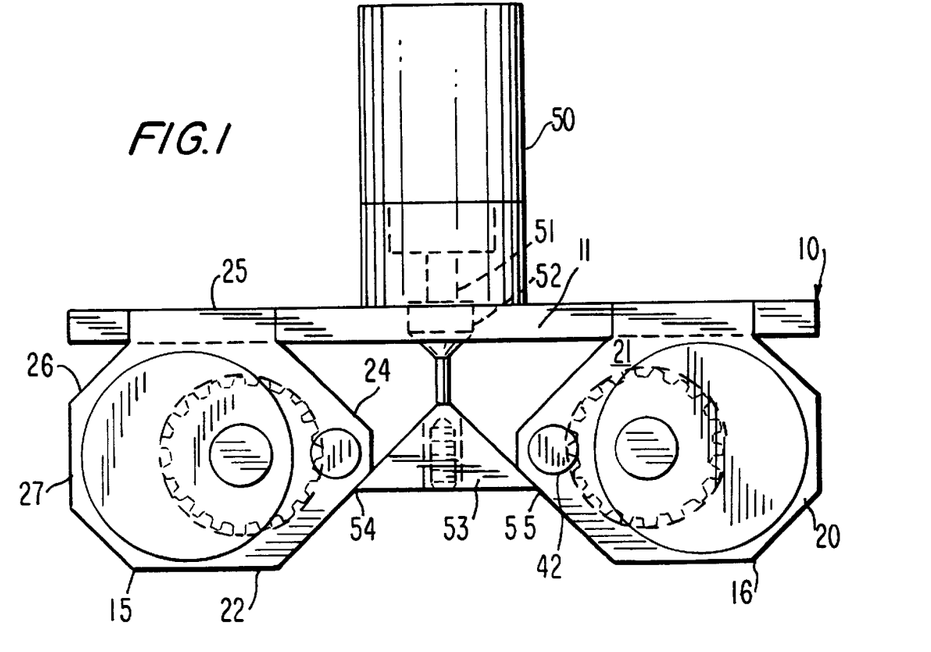
FIG. 1 is a schematic top plan view of a preferred embodiment of the invention showing a minimum pitch adjustment between the axes of a pair of vacuum shafts.
Figure 2:
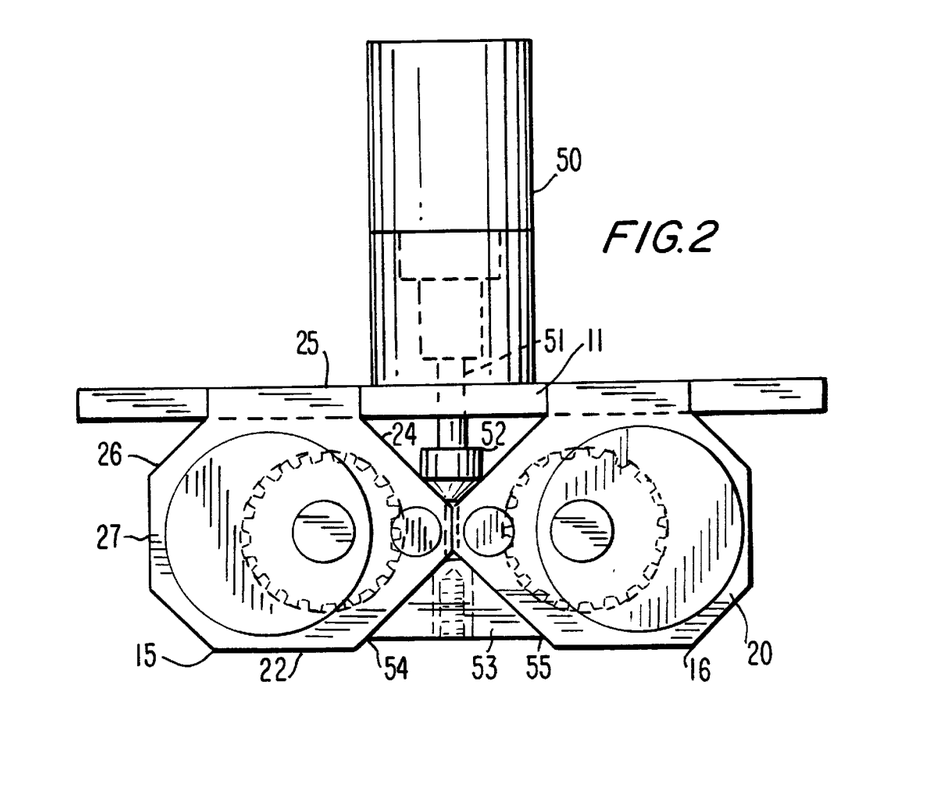
FIG. 2 is a similar top plan view showing maximum pitch adjustment.

In accordance with the principal embodiment of the invention, generally indicated by reference character 10, the device comprises a supporting rail 11 which is connected to transporting means (not shown) well-known in the art. Mounted on the rail 11 are first and second vacuum head units 15 and 16 which are substantially similar, but positioned in opposed relation so as to provide minimum pitch distance between the axes of the vacuum shafts. FIG. 1 illustrates maximum available pitch, while FIG. 2 illustrates minimum pitch.

Figure 4:
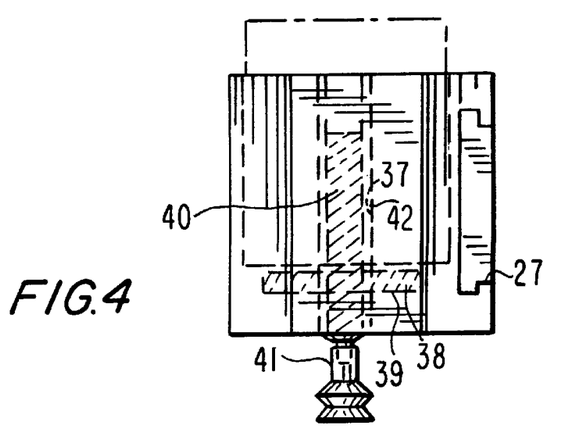
FIG. 4 is a schematic end elevational view thereof.

Each of the units 15–16 includes a polygonally shaped body 20 bounded by an upper surface 21, lower surface 22, and side surfaces 23, 24, 25, 26, 27, and 28, the surface 28 serving as a cam follower. Channel forming means 29 (FIG. 4) permits movement of each unit 15–16 along the principal axis of the rail 11.

Figure 3A:
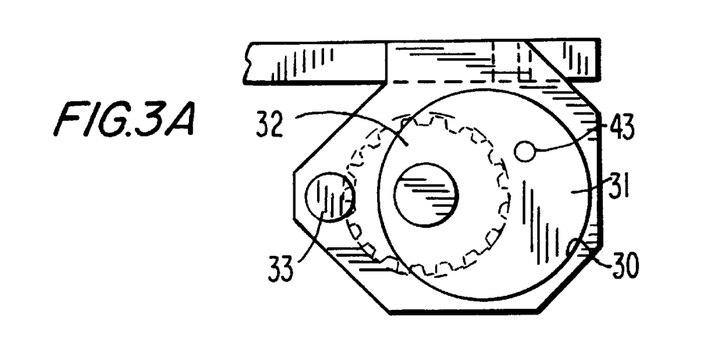
FIG. 3A is a schematic fragmentary bottom plan view thereof.
Figure 3B:
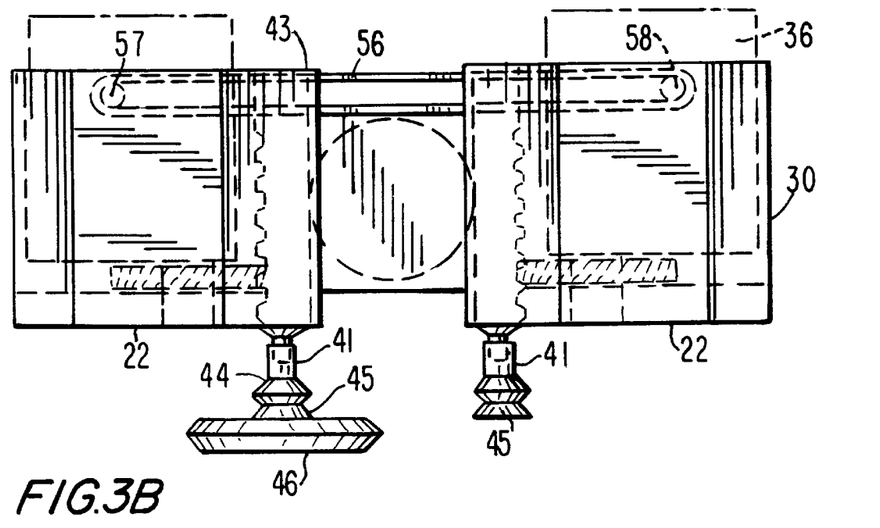
FIG. 3B is a schematic side elevational view thereof.

The body 20 defines a generally vertical axis chamber 30 including first, second, and third bores, 31, 32, and 33, respectively. The first bore 31 mounts a rotary stepper motor 36 having an output shaft 37 mounting a helical gear pinion 38. The outer surface 39 of the pinion 38 mates with a helical rack 40 on a vertically oriented vacuum spindle 41 which includes an anti-rotation key 42. An upper end 43 connects to a controlled vacuum supply (not shown) as is known in the art. A lower end 44 mounts a vacuum cup 45 adapted to selectively engage a workpiece 46 (FIG. 3).

Operation of the disclosed structure will be apparent from a consideration of the drawings. The rotary stepper motor is controlled by computer means known in the art, and its actuation transmits motion through the pinion and helical rack to advance and retract the spindle shaft as required. Each of the units 15 and 16 may be operated independently, or they may be operated together depending upon requirements.

One of the problems which arises when dual vacuum head units are employed lies in the need for providing adjustment of the distance between the vacuum shafts of each unit, which may be referred to as "pitch". The problem will occur, for example, when a pair of workpieces at the pick location are spaced a relatively close distance while the corresponding locations at the point of placement are spaced apart a greater distance. There thus arises the need for varying the pitch, which usually will occur while the workpieces are in transit between the pick and place locations.

Referring to FIGS. 1 and 2, the required adjustment means includes a linear drive stepper motor 50 having an output shaft 51 which rides in a bearing 52. At the free end of the shaft 51 is a triangularly-shaped cam 53 having first and second camming faces 54 and 55. Referring to FIG. 3, an elastomeric band 56 engages first and second studs 57 and 58 to urge the units toward each other and in contact with the operative faces of the cam 53. The motor 50 is also computer controlled and can perform the adjustment while the entire device is moving between pick and place locations.

Figure 5:
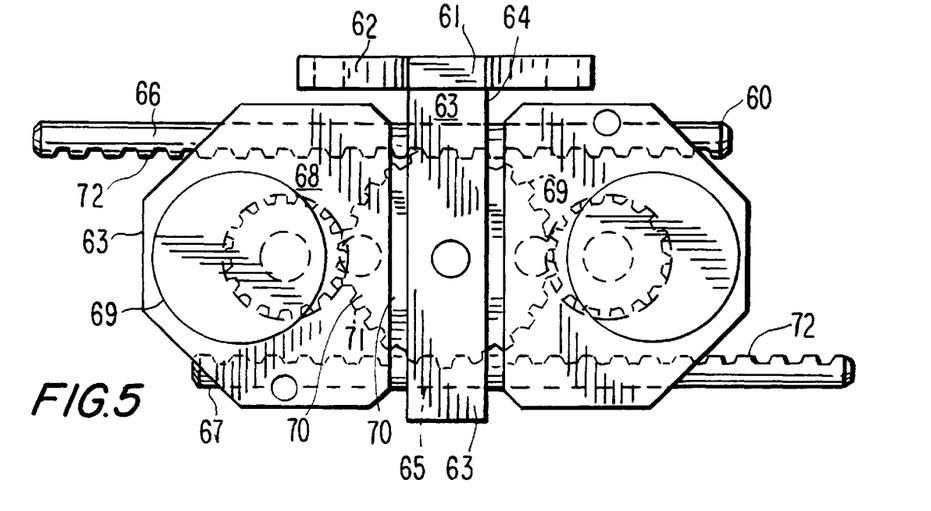
FIG. 5 is a schematic top plan view showing an alternate embodiment of the invention.
Figure 6:
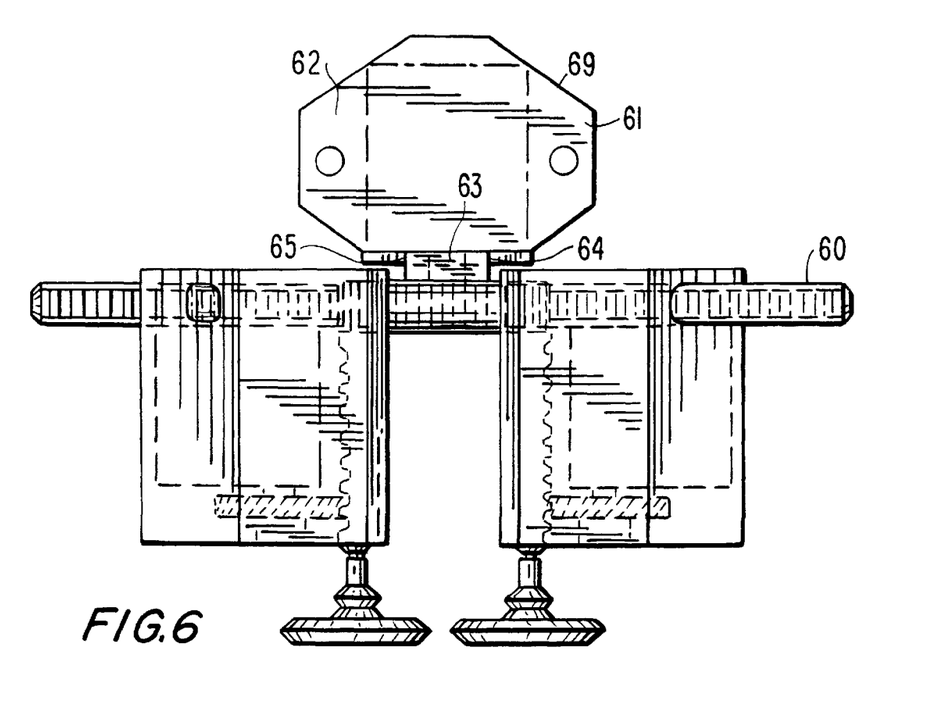
FIG. 6 is a schematic side elevational view of the alternate embodiment.

Turning now to FIGS. 5 and 6 in the drawings, there is illustrated an alternate form of the preferred embodiment which differs from the principal form in the means for obtaining the above-described pitch adjustment. In the alternate form, generally indicated by reference character 60, the rail 11 of the principal embodiment is substituted by a mounting bracket 61 including a transverse mounting member 62 and a support member 63 which extends between the vacuum head elements. The member 63 forms channels at 64 and 65, which slidably mount first and second rectilinear rack members 66 and 67. An upper surface 68 of the member 63 mounts a rotary pitch motor 69 which drives a pinion 70, the teeth 71 of which engage corresponding teeth 72 on each of the racks.

This alternate construction offers several key features. One important feature is the placement of all three driving motors in one plane forward of the mounting bracket. This relationship allows the pick and place unit to be easily mounted to appropriate prime movers known in the art such as XY gantries or tables.

Another feature is the co-planar configuration of the two horizontal racks perpendicular to the Z axis. In this attitude, they serve not only as the translating mechanism to convert rotary to linear motion for varying head-to-head pitch, but also serve as the bearing guide system to keep the heads in proper alignment with respect to each other, as well as the gantry, or other defined mounting surface.

Figures 7, 8:
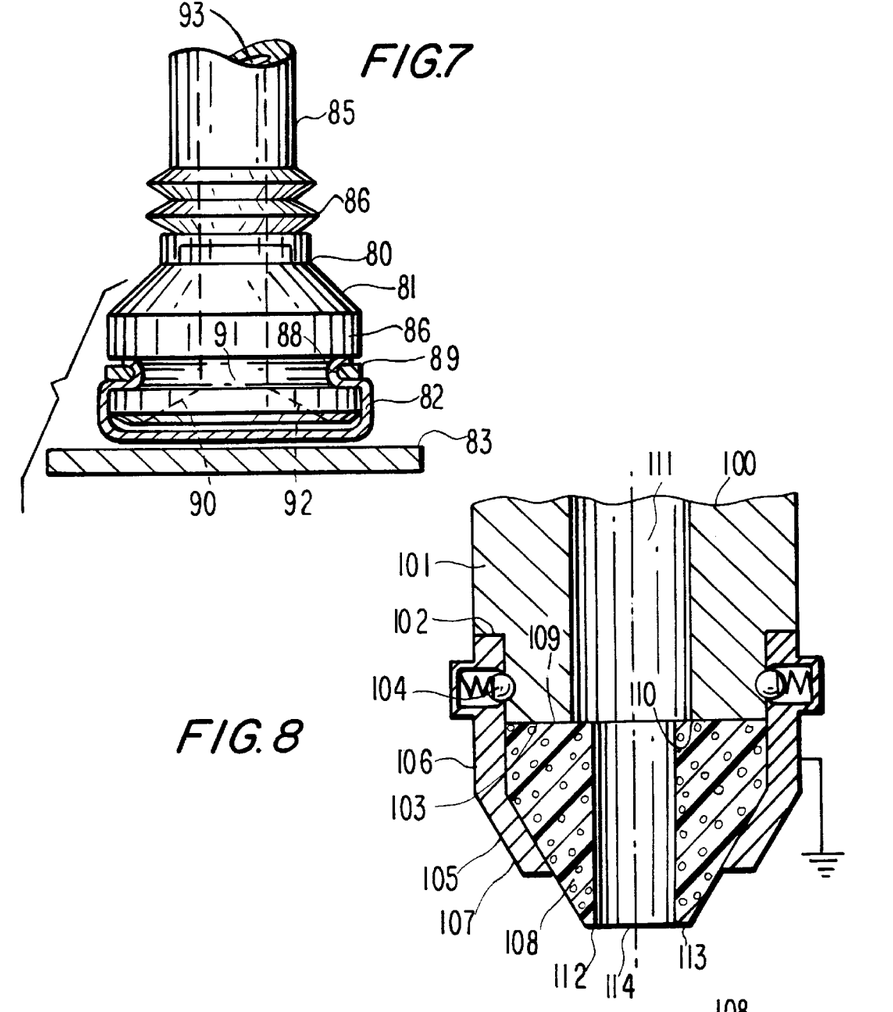
FIG. 7 is a fragmentary schematic side elevational view showing a vacuum head construction used with either of the preferred alternative embodiments.
FIG. 8 is a fragmentary schematic side elevational view of an alternate form of vacuum head construction.

Referring to FIG. 7, there is illustrated an alternate form of vacuum pick-up to replace the conventional vacuum cup. This construction is particularly suitable for use where the object to be picked up is a computer chip, the engaged surface of which is other than completely planar.

Instead of the conventional rubber or elastomeric vacuum cup, there is provided a membrane typically of expanded Teflon fastened to a resilient housing with a retaining ring. The purpose of the membrane is two-fold. It acts as a gasket by virtue of its compliant character to place the pick-up and object in intimate contact as required by a vacuum pick-up device. An electro-formed precision metal bellows serves to absorb any gross planar alignment difference between the pick-up and the object.

A second function of the membrane is to create an even dispersion of pressure drop over the surface of the object to be picked. Since it is flexible, it can absorb surface irregularities. For example, the disclosed device has been demonstrated to be capable of picking up a "BGA" ball grid array chip from the ball side of the chip. In this case, the planar surface is dotted with small solder balls. This is a dramatic example of the effectiveness of the membrane technology in picking up difficult (non-smooth) objects. The membrane provides a controlled flow of vacuum on the surface of the object. This allows a wider tolerance of surface irregularities, since the total vacuum can be considered as an integration of individual pores in the membrane. In the case of a traditional vacuum system using a vacuum cup, even a slight irregularity in surface contact can lead to total loss of vacuum. Using the disclosed membrane, the individual pores in the membrane provide adequate suction, since they provide a plurality of vacuum sources.

Referring to FIG. 7 in the drawing, the pick-up 80 includes a cylindrical housing 81 supporting a foam membrane 82 which engages a workpiece 83, such as a computer chip. A vacuum spindle 85 interconnects the head 80 through a precision bellows 86.

The outer surface 87 of the housing 81 includes an annular groove 88 which engages a resilient retainer ring 89 which clamps the peripheral portions of the membrane 82. The lower surface 90 of the housing includes a circular portion 91 surrounding a flared recess 92 which communicates with a bore 93 to the vacuum source. As a result, vacuum suction is applied over substantially the entire central portion of the membrane, as contrasted with only the peripheral portions of the conventional vacuum cup.

Figure 9:
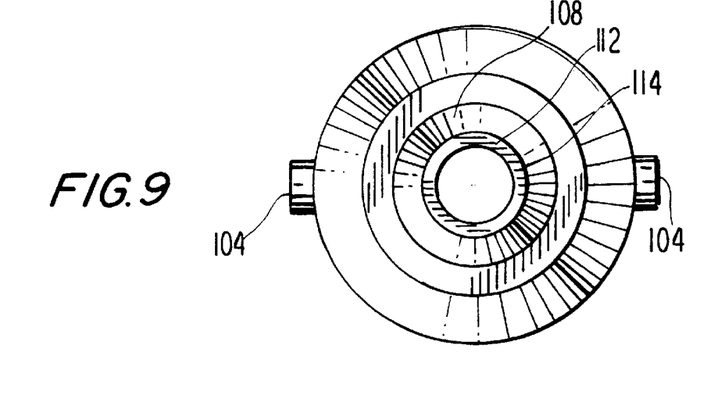
FIG. 9 is a bottom plan view as seen from the lower portion of FIG. 8.

FIGS. 8 and 9 show an alternate form of vacuum probe having static dissipative capability. Conductive foam provides an excellent dissipative static drain for handling static sensitive chips. Such foam, however, is not highly shape-recoverable as a result of conductive doping. The disclosed geometry is designed to provide a means which is essentially of conical form to provide an effective seal region or lip seal.

The probe is formed by sandwiching a conductive foam element between a housing and a spindle. A ball detent provides a quick release for replacing the foam or changing sizes of the probe. In combination, the spindle housing combination nests the foam while allowing it to be compressed along its axis freely, and hence, free to return to its original shape releasing vacuum. The cone serves to provide both a beneficial lip seal and an elastomeric spring-type action. To maximize memory shape, it is desirable to obtain as much volumetric foam material near the working surface of the foam as possible. The cone shape provides this dual function.

Where necessary, multiple probes, (not shown), can be combined in a matrix to provide greater lift for heavier objects or larger ones. The housing serves not only to captivate the foam element, but also serves as a conductive surface to facilitate a path to ground for dissipating static charges. In semi-conductor handling, static dissipation is crucial to prevent destruction of the chip.

This embodiment, generally indicated by reference character 100 (FIGS. 8 and 9), includes a cylindrical spindle 101 having a rabbeted recess 102 at a lower end 103 thereof which includes spring detent means 104. A housing 105 having a cylindrical upper portion 106 is engaged in the recess 102. A lower frusto-conical portion 107 encloses and retains a conductive foam member 108. The upper surface 109 thereof engages a lower surface 110 of the spindle 101 to provide a continuous passage 111 to the frusto-conical tip 112 of the member 108. This tip includes a peripheral arcuate surface 113 defining a seal region 114 which engages the workpiece (not shown).

Figure 10:
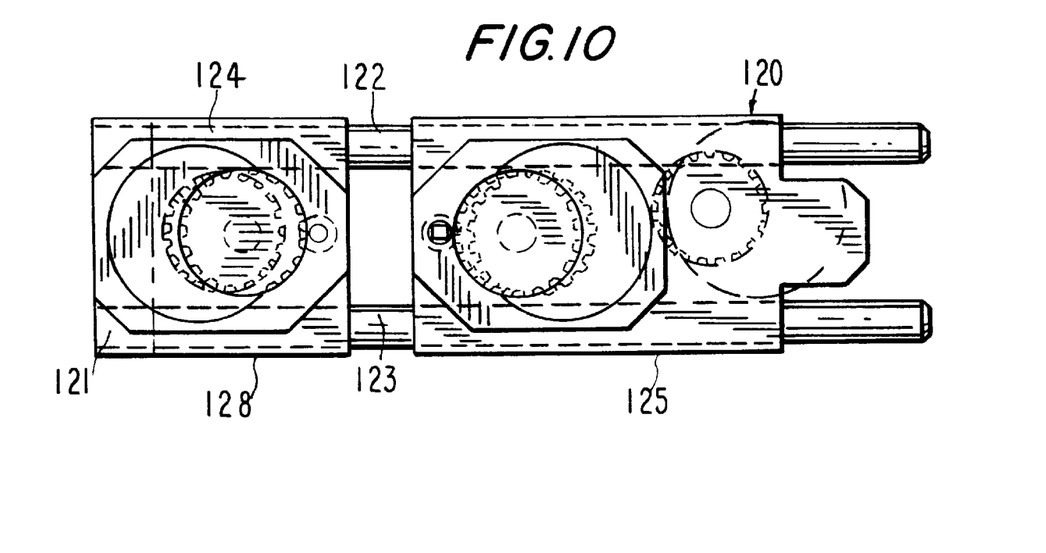
FIG. 10 is a top plan view of a further embodiment of the invention.
Figure 11:
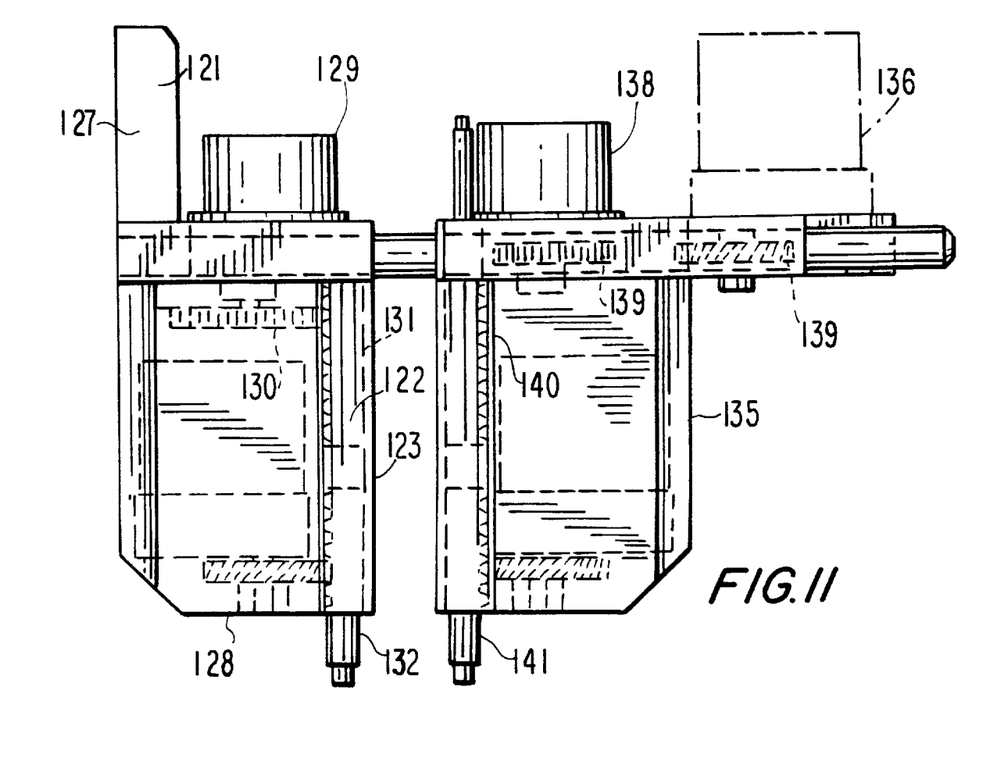
FIG. 11 is a side elevational view thereof.

FIGS. 10 and 11, inclusive, illustrate a further alternate form of head element which provides not only for the raising and lowering of the spindle, but the axial rotation of the spindle of each of the heads for use in those installations which require as a part of the pick and place operation, an axial rotation of the workpiece which is accomplished as the workpiece is transported to its place position. This is accomplished by providing each head with an additional motor which drives a pinion engaging a corresponding gear on a sleeve engaged upon the spindle in splined relation.

In this embodiment, generally indicated by reference character 120, a supporting frame 121 includes a cylindrical rack 122 a nd a parallel guide 123 which support a first or reference block 124 in fixed relation. A second adjustable block 125 is capable of movement to vary the effective pitch therebetween.

The first block 124 includes a mounting bracket 127 of required configuration which may be attached either to the frame 121 or the main housing 128. A first motor 129 provides for axial rotation of the spindle about its own axis. It mounts a driven gear 130 which drives a rotating sleeve 131 splined to the spindle 132.

The second block 125 includes a main housing 135 which mounts a pitch adjustment motor 136 having a pinion 137 which engages the rack 122. It also mounts a motor 138 which corresponds to the motor 129, this motor driving a gear 139 rotationally driving a sleeve 140 in splined relation to the spindle 141.

Figures 12, 13:
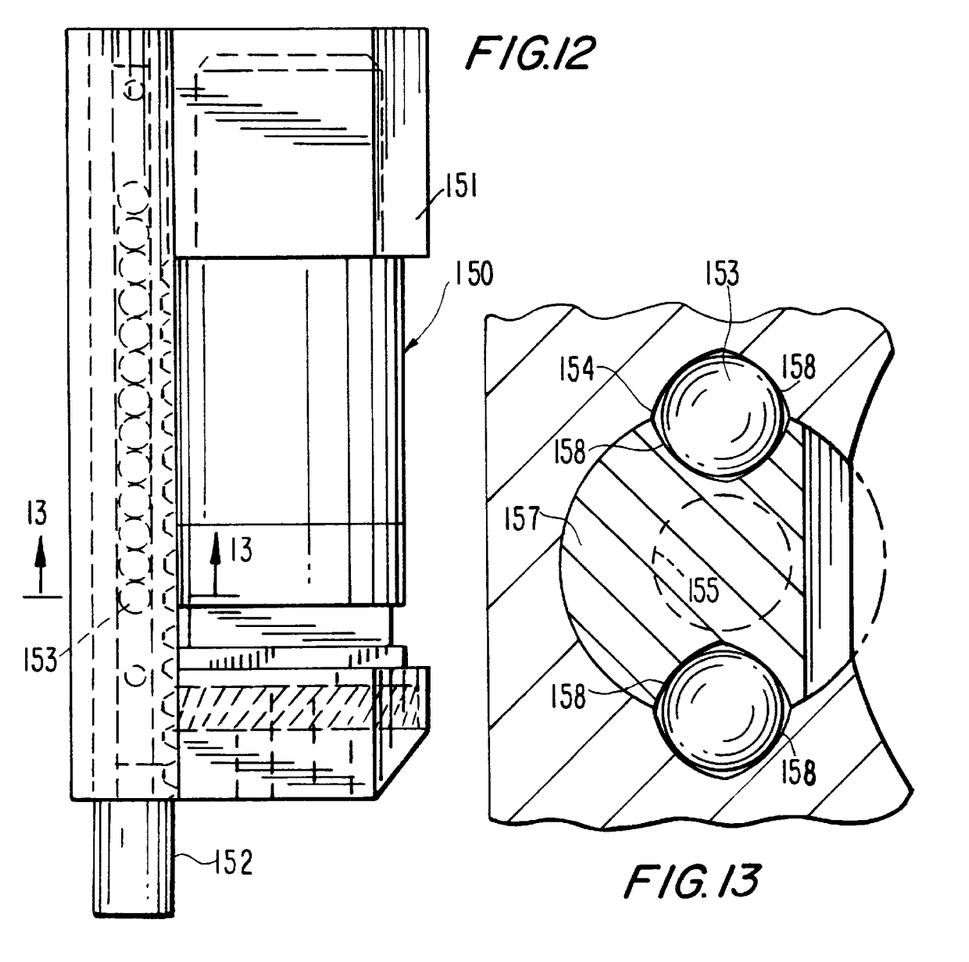
FIG. 12 is a schematic side elevational view of a fourth embodiment of the invention.
FIG. 13 is a sectional view as seen from the plane 13—13 in FIG. 12.
Figure 14:
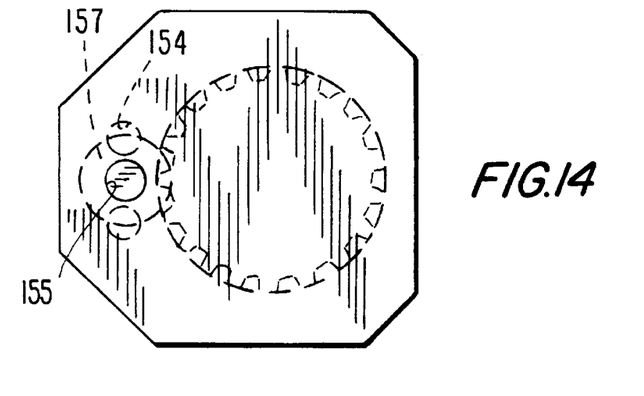
FIG. 14 is a top plan view thereof.
Figure 15:
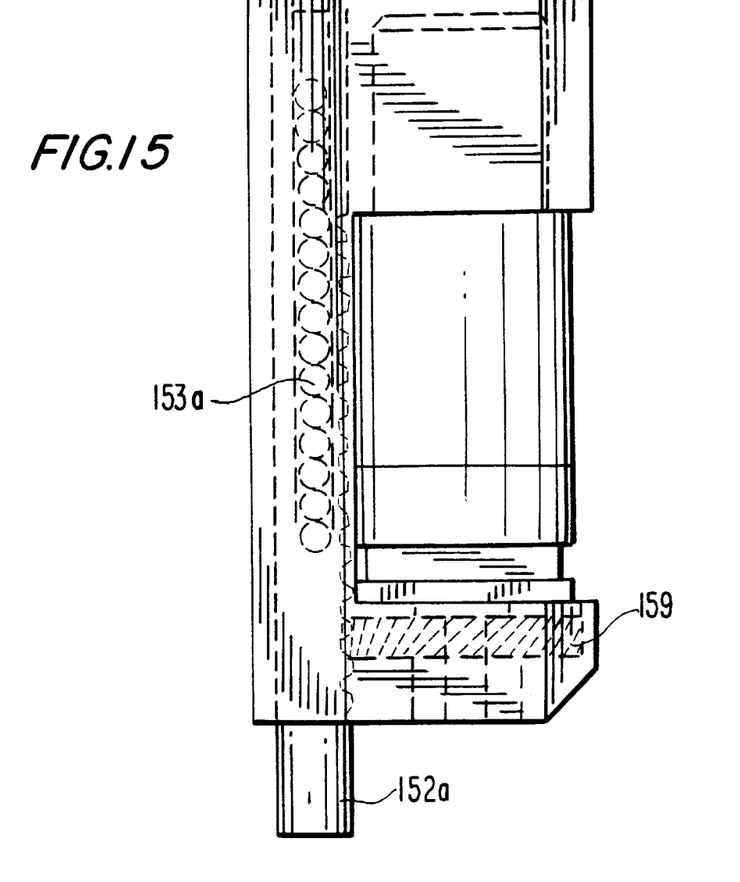
FIG. 15 is a schematic side elevational view of an alternate form of the fourth embodiment.

Turning now to the fourth embodiment of the invention, generally indicated by reference character 150, there is illustrated a further modification.

In the principal embodiment, the rack and pinion driven pick and place head relies on a sleeve type bearing to guide the rack in a vertical linear traverse as well as a key to keep the rack from rotating. At relatively high speeds (over ten inches per second), friction becomes a substantially limiting force in this bearing system.

Figure 16:
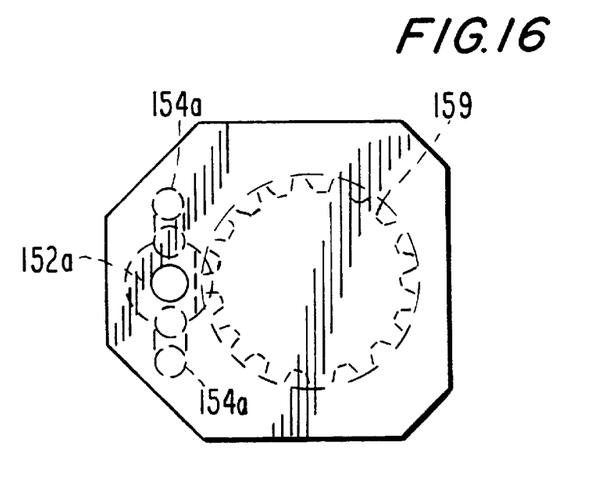
FIG. 16 is a top plan view thereof.

This limitation is ameliorated in the use of a ball bearing based anti-friction rack and pinion. FIG. 13 depicts a limited travel version while FIG. 16 depicts an unlimited travel version using recirculating ball bearings.

The bearings system consists of a housing 151 enclosing a cylindrical rack 152 and ball bearings 153 moving in raceways 154 on opposed sides of a bore 155. The cross section of the raceways shown is that of a Gothic arch, although other configurations are also practical. Corresponding raceways 156 are machined into the rack 157. In operation, a four point bearing system is created at points 158 resulting from the Gothic arch geometry.

In combination, the rack and housing create linear raceways for the ball bearings to ride in. In addition to providing a linear bearing for the rack, this configuration also acts to resist torque on the rack in effect acting like a key to prevent rotation of the rack within the bore. The ability of this system to resolve complex motion eliminates friction that impedes high speed rack movement.

Because the ball bearings are of very small diameter, it is not practical to provide a cage to contain them. Due to the decontaminated environs in which devices of this type operate, it is not possible to provide any fluid lubricant in the raceway. I have found that any resultant friction between adjacent balls can be substantially eliminated by forming alternate balls of hardened steel and nylon, the nylon balls having a slightly smaller diameter so that the load is carried by the steel balls.

In the alternate form shown in FIG. 16, parts corresponding to those shown in the principal form have been designated by similar reference characters with the additional suffix "a".

This form differs from the principal form in the provision of a looped raceway providing for recirculating ball bearings to permit a greater degree of axial excursion of the rack 152a.

It is to be noted that the bore 155 is open along one side to allow engagement of the helical teeth 159 with a driving gear. This fact allows a slight degree of resiliency in the housing, and enables the ball bearings to have a small degree of preloading without the use of other preloading means.

Figure 17:
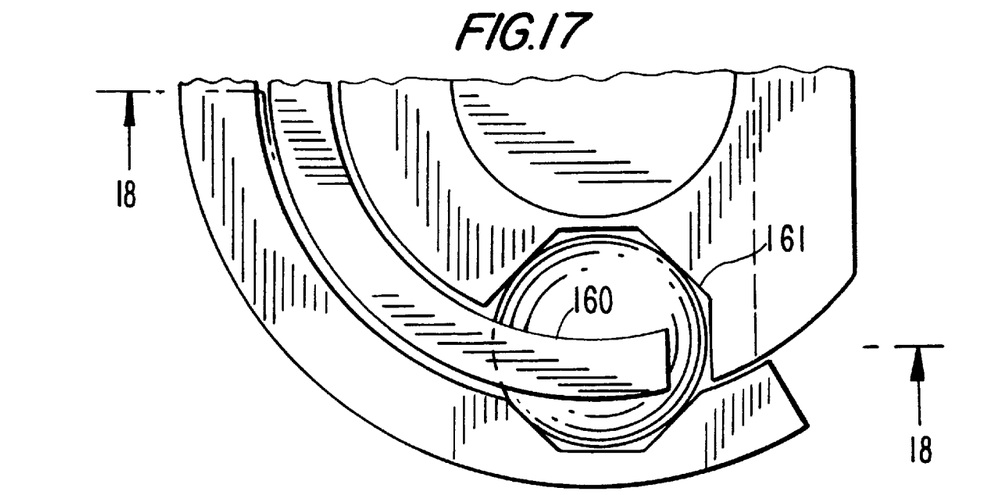
FIG. 17 is a schematic top plan view showing an alternate form of bearing construction.
Figure 18:
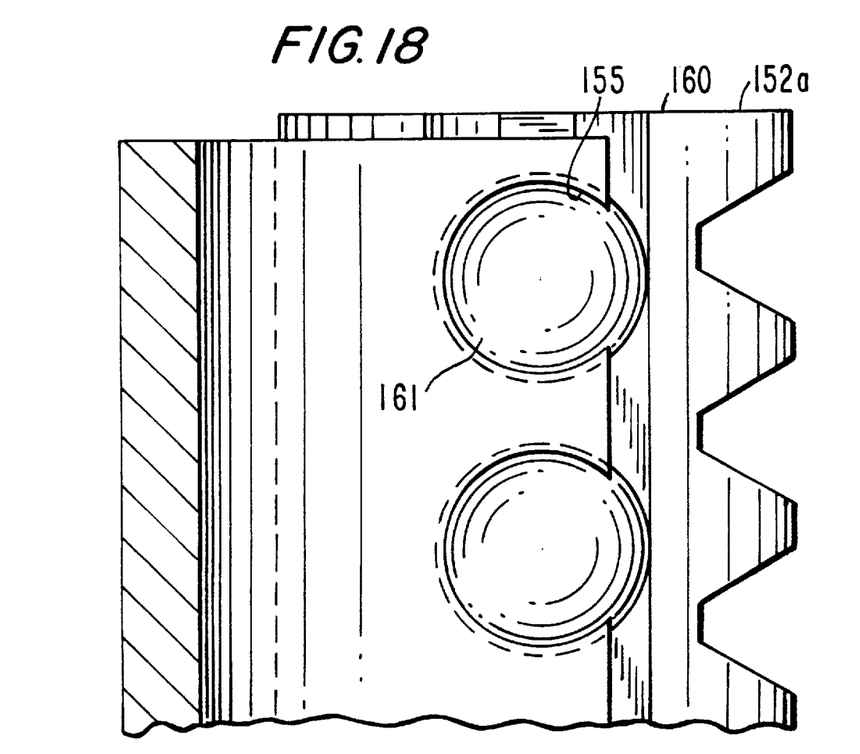
FIG. 18 is a fragmentary sectional view as seen from the plane 18 in FIG. 17.

Turning now to the embodiment shown in FIG. 17, there is illustrated an optional plastic raceway 160 used to retain the ball bearings 161. The raceway is molded of synthetic resinous materials and defines sockets 162 into which the bearings may be seated, so that the raceway and bearings form a single unit facilitating assembly of the device.

Figure 19:
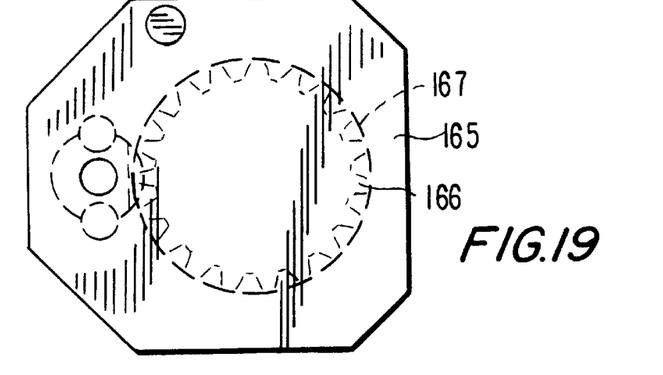
FIG. 19 is a schematic top plan view showing a further modification.
Figure 20:
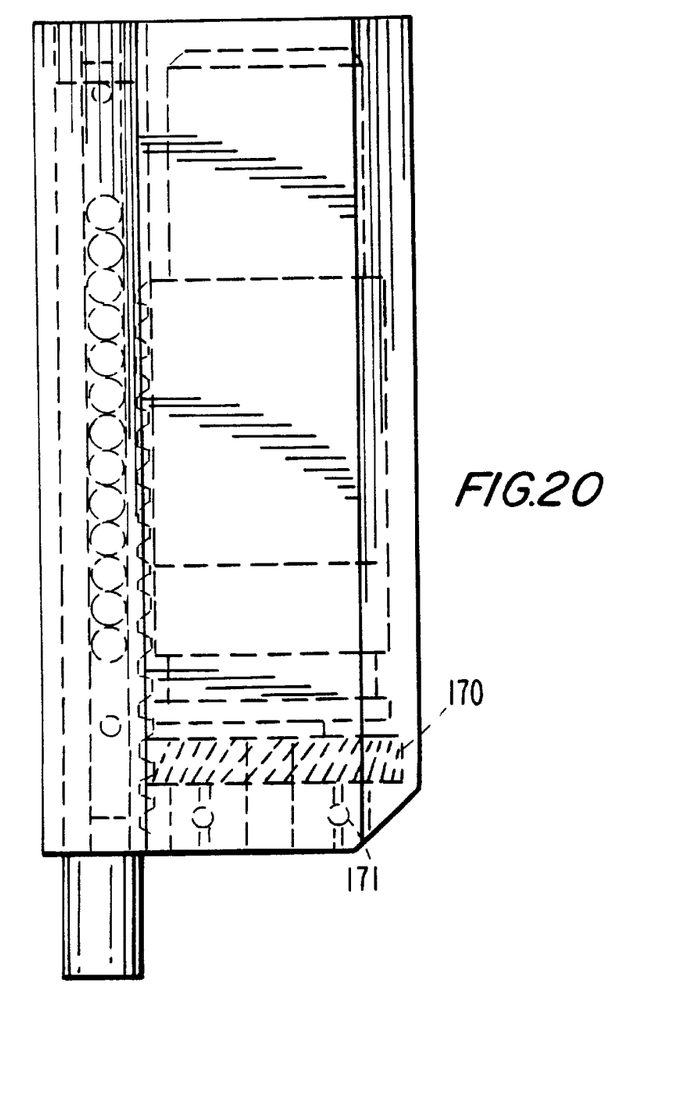
FIG. 20 is a schematic sectional view thereof.

In the embodiment shown in FIGS. 19 and 20, there is illustrated a means whereby the housing 165 may be used to provide a heat sink for conducting heat away from the motor 166. This is accomplished by providing a thermally conductive compound such as a grease 167. It is to be understood that the small motors used in pick and place applications generate large amounts of heat during operation which requires adequate ventilation not available when the motor is housed.

To overcome lateral forces generated by the use of the helical gear 170, I also provide angularly oriented ball bearings 171.

It may thus be seen that I have invented novel and highly useful improvements in pick and place head construction, in which it is possible to completely eliminate the use of known pneumatic units with their accompanying disadvantages. By using computer controlled driving motors, precise control of movement of the pick-up shafts is assured, and the device may be readily serviced by replacing any defective element, normally without the necessity of disconnecting the device from the gantry or table. By the use of synthetic foam materials to replace the traditional vacuum cup, it is possible to provide effective engagement with the surface of a workpiece or article to be transported, in which the surface is other than completely planar, without difficulty. By the use of doped foam material, it is possible to provide a static dissipating function as the workpiece is engaged as may be required when transporting certain types of workpieces. Further, where required, means is provided for not only picking up and placing the workpieces, but for rotating the same about the axis of the pickup spindle for use in those applications where the article must be rotated as it is transported between pick and place positions.

I wish it to be understood that I do not consider the invention to be limited to the precise details of structure shown and set forth in the specification, for obvious modifications will occur to those skilled in the art to which the invention pertains.

I claim:

1. In a device for transporting workpieces from a first to a second location by vacuum engagement of a reciprocating spindle, the improvement comprising: an elongated supporting means; at least a first vacuum head element supported upon said means, said vacuum head element having a rotary motor having an output shaft; a helical pinion driven by said shaft, said reciprocating spindle having a helical rack on a surface thereof, said rack meshing with said pinion; whereby controlled rotation of said motor imparts reciprocating movement of said spindle within predetermined limits.

2. The improvement set forth in claim 1, further comprising a second vacuum head element supported upon said means, whereby a pair of workpieces may be simultaneously engaged and transported between first and second locations.

3. The improvement set forth in claim 2, wherein at least one of said first and second vacuum head elements is slidably adjustable along the axis of said means.

4. The improvement set forth in claim 3, further comprising a pitch adjustment element for varying the distance between the spindles of said first and second head elements.

5. The improvement set forth in claim 4, said pitch adjustment element including a linear driven stepper motor mounted upon said means, said motor having an axis of shiftable motion along said shaft; and a cam follower surface on at least one of said vacuum head elements; whereby movement of said stepper motor shaft shifts said vacuum head elements adjustably along said means.

6. The improvement set forth in claim 5, further comprising said second vacuum head slidably carried by said means, a cam having first and second camming surfaces engaging corresponding cam follower surfaces on each of said vacuum head elements to simultaneously shift the position of each vacuum head element, thereby varying the pitch distance between the vacuum spindles of each element.

7. The improvement set forth in claim 6 further comprising resilient means for urging said vacuum head elements in to engagement with said camming surfaces.

8. The improvement in accordance with claim 7, said pitch adjustment element including a mounting bracket, a pair of rectilinear rack members carried in sliding relation by said mounting bracket, each rack coupled to a respective vacuum head element, a rotary motor carried by said mounting bracket having an output shaft, a pinion carried by said shaft, said pinion simultaneously driving each of said rectilinear rack members.

9. The improvement set forth in claim 4, in which said pitch adjustment element comprises a fixed linear rack, a motor carried by one of said first and second vacuum head elements, and a pinion driven by said motor; said pinion engaging said rack to vary the degree of pitch between said first and second vacuum head elements.

10. The improvement set forth in claim 1 in which said vacuum head element comprises a housing supported by said spindle, said housing having a central bore communicating with a vacuum source connected to said spindle, said housing having a radially-oriented surface defining a free end thereof, and a porous foam member overlying said radially-oriented surface, an outer surface thereof being adapted to engage a surface of an article to be transported.

11. The improvement set forth in claim 1, further comprising a second motor, a second pinion driven by said second motor, a sleeve surrounding said spindle in splined relation thereto, said second pinion engaging said sleeve in geared relation to impart axial rotation of said spindle.

12. In a device for transporting workpieces from a first to a second location by vacuum engagement of a reciprocating spindle, the improvement comprising: an elongated supporting means; first and second vacuum head elements supported upon said supporting means, said vacuum head elements each having a rotary motor having an output shaft, a helical pinion driven by said shaft, said reciprocating spindle having a helical rack on a surface thereof, said rack meshing with said pinion; whereby control rotation of said motor imparts reciprocating movement to said spindle within predetermined limits; at least one of said first and second vacuum head elements being slidably adjustable along an axis of said supporting means; and a pitch adjustment element for varying the distance between the spindles of said vacuum head elements, said pitch adjustment element including a mounting bracket, a pair of rectilinear rack members carried in sliding relation by said mounting bracket, each rectilinear rack member being coupled to a respective head element, a rotating motor carried by said mounting bracket having an output shaft, said shaft having a pinion; said pinion simultaneously driving each of said rectilinear rack members.

13. In a vacuum head element for transporting workpieces from a first to a second location by means of vacuum engagement of a reciprocating spindle, the improvement comprising: a relatively fixed housing defining an elongated bore, a cylindrical rack carried by said housing within said bore for axial reciprocation therein, a first ball-bearing raceway in an outer surface of said rack, a corresponding raceway in said bore, and ball bearings carried by said raceways; whereby said ball bearings provide a continuous bearing surface between said housing and said rack, and a keying function to prevent relative axial rotation therebetween; and a second raceway in each of said bore and said rack, positioned 180 degrees relative to said first raceway and corresponding raceway.

14. The improvement in accordance with claim 13, in which said ball bearings are alternately formed of steel and nylon.

15. The improvement in accordance with claim 13 in which said ball bearings are encased within a synthetic resinous raceway.

16. The improvement in accordance with claim 13, further comprising a motor for driving said rack, said motor being positioned within said housing; and a thermally conductive compound positioned between said motor and said bearing for transferring heat generated by said motor to said housing to enable said housing to serve as a heat sink.

17. The improvement in accordance with claim 16, said motor having an output shaft, a helical gear on said shaft, and angularly oriented ball bearings for observing thrusts generated by said helical gear.

18. In a device for transporting workpieces from a first to a second location by vacuum engagement of a reciprocating spindle having a vacuum head, the improvement comprising: a housing supported by said spindle, said housing having a central bore communicating with a vacuum source connected to said spindle, said housing having a radially oriented surface defining a free end thereof, and a porous foam member overlying said radially oriented surface, an outer surface thereof being adapted to engage a surface of an article to be transported, wherein vacuum is drawn through the pores of said porous foam member, and said porous foam member conforms to said surface upon engagement therewith.

* * * * *